(12) United States Patent
Wicker

(10) Patent No.: US 8,120,940 B2
(45) Date of Patent: Feb. 21, 2012

(54) PROGRAMMABLE RESISTANCE MEMORY

(75) Inventor: Guy Wicker, Southfield, MI (US)

(73) Assignee: Ovonyx, Inc., Troy, MI (US)

( * ) Notice: Subject to any disclaimer, the term of this patent is extended or adjusted under 35 U.S.C. 154(b) by 497 days.

(21) Appl. No.: 12/291,111

(22) Filed: Nov. 6, 2008

(65) Prior Publication Data

US 2010/0110780 A1    May 6, 2010

(51) Int. Cl.
*G11C 11/00*    (2006.01)
(52) U.S. Cl. .......................... 365/148; 365/163
(58) Field of Classification Search .................. 365/148, 365/163, 189.16; 327/78, 334
See application file for complete search history.

(56) References Cited

U.S. PATENT DOCUMENTS

| | | | |
|---|---|---|---|
| 6,608,773 B2 * | 8/2003 | Lowrey et al. | 365/100 |
| 2006/0220688 A1 * | 10/2006 | Hsu et al. | 327/77 |
| 2009/0166601 A1 * | 7/2009 | Czubatyj et al. | 257/3 |

* cited by examiner

*Primary Examiner* — Vu Le
(74) *Attorney, Agent, or Firm* — Kevin L. Bray

(57) ABSTRACT

A minimal-duration current pulse is employed to program a programmable resistance memory to a high-resistance, RESET state. Although the duration and magnitude of RESET programming pulses in accordance with the principles of the present invention may vary depending, for example, upon the composition and structure of a cell, a method and apparatus in accordance with the principles of the present invention employs the briefest pulse practicable for a given cell or array of cells.

14 Claims, 7 Drawing Sheets

PROGRAMMABLE RESISTANCE MEMORY

CROSS-REFERENCE TO RELATED APPLICATIONS

N/A

FIELD OF INVENTION

This invention relates to electronic memory circuits.

BACKGROUND OF THE INVENTION

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories. Among the technologies being investigated are phase change memory technologies. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity varies by two or more orders of magnitude when the material passes from the amorphous (more resistive) phase to the crystalline (more conductive) phase, and vice versa. Further, the resistivity of the chalcogenide materials generally depend on the temperature with the amorphous state generally being more temperature dependent that the crystalline state.

A chalcogenide memory device may utilize the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C. for GST 225) and then cool it off rapidly, i.e. quench. From the electrical standpoint, it is possible to reach the crystallization and melting temperatures by causing a current to flow through a resistive element that heats the chalcogenic material by the Joule effect.

Each memory state of a chalcogenide memory material corresponds to a distinct range of resistance values and each memory resistance value range signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron-Devices, vol. 51, p. 714-719 (2004) by Pirovana et al.; and "Morphing Memory," published in Science News, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may be deposited with a reactive sputtering process with gasses such as $N_2$ or $O_2$: forming a chalcogenide nitride, or oxide, for example and chalcogenide may be modified by an ion implantation or other process.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Although highly reliable and fast, a method and apparatus that improves the operating speed and/or increases the number of cycles a phase change memory may operate would be highly desirable.

SUMMARY OF THE INVENTION

A method and apparatus for a phase change memory in accordance with the principles of the present invention employs minimal-duration current pulses to program a cell to a RESET state. In accordance with the principles of the present invention, the briefest programming pulse practicable may be used to RESET a phase change memory cell. Although the duration and magnitude of RESET programming pulses in accordance with the principles of the present invention may vary depending, for example, upon the composition and structure of a cell, a method and apparatus in accordance with the principles of the present invention may employ the briefest pulse practicable for a given cell or array of cells.

In an illustrative embodiment the amplitude of RESET programming pulses is set to a magnitude that raises the temperature of a programmed volume of phase change material within the cell to the phase change material's melting point within a period of time no greater than 5% of the RESET pulse's overall duration. A RESET pulse's overall duration may be configured to be no greater than 20% of the duration of a corresponding SET pulse employed to SET the cell. In such an embodiment, the "time-to-melt" (that is, the time between the initiation of the RESET pulse and the time the phase change material melts), is no more than 10 ns, preferably no more than 1 ns, and more preferably no more than 500 ps. In another illustrative embodiment in accordance with the principles of the present invention, the amplitude of RESET programming pulses may be set to a value that raises the temperature of a programmed volume of phase change material within the cell to the phase change material's melting point within a period that is no greater than the electrical time constant of the cell, with the time constant of the cell determined by the line capacitance of the array and the resistance of the memory cell. In other illustrative embodiments the total pulse width of a RESET pulse in accordance with the principles of the present invention is no greater than 5, 2, or 1 ns or 500 ps.

In an illustrative memory array, the amplitude of a RESET pulse is set substantially equal to a value that raises the temperature of a programmed volume of phase change material within the least-readily amorphized cell within the array to the phase change material's melting point within a period that is no greater than the electrical time constant of the cell, with the time constant of the cell determined by the line capacitance of the array and the resistance of the memory cell. In accordance with the principles of the invention the amplitude of the RESET pulse may be selected to avoid over-RESETing the most readily amorphized cell within the memory array. The phenomenon of over-RESETing is one whereby the SET operation of a phase-change memory is negatively affected by a RESET operation. In particular, the time required to SET an over-RESET device is increased relative to the time required to SET the same device when it has not been over-RESET. Although the phenomenon is not well understood, the instant inventor believes that a RESET pulse that applies power to a memory element for an extended period of time may reduce the number of nucleation sites within an active volume of the memory element's phase change material and/or melt too large a volume of phase change material, thereby delaying the onset of crystallization in a subsequent SET operation.

In another illustrative embodiment, an apparatus and method in accordance with the principles of the present invention may employ a plurality of pulses to RESET a cell. In such an embodiment, the pulse amplitudes and widths are configured to raise the temperature of an active volume of the least readily amorphized cell within an array to at least the melting temperature of the phase change material for a cumulative time-at-melt substantially equal to the minimal RESET period for the cell. In an illustrative embodiment the cumulative time of the plurality of access pulses and of the periods in between pulses is no greater than the period associated with a SET operation for the same cell. In an illustrative embodiment, the SET period is substantially equal to the minimum period of time required to crystallize an active volume of phase change material within the least-readily crystallized memory cell within the array.

In accordance with another aspect of the invention, a plurality of narrow pulses may be employed to SET a cell. In such an embodiment, each of the plurality of pulses is of sufficient amplitude to raise at least a portion of the active volume of a phase change memory cell to the material's crystallization temperature, but not of sufficient amplitude to raise the material to the material's melting temperature.

In accordance with the principles of the present invention, multiple narrow access pulses may be employed to RESET and/or SET a phase change memory cell. In such an embodiment, each of the RESET pulses may be of sufficient magnitude to amorphize a portion of the active volume of the least readily amorphized cell within the array, yet not of such magnitude as to over-RESET the most readily amorphized cell within the array; each of the SET pulses may be of sufficient amplitude to raise at least a portion of the active volume of a phase change memory cell to the material's crystallization temperature, but not of sufficient amplitude to raise the material to the material's melting temperature; and a successive approximation method may be employed to bring a cell to a desired states as rapidly as possible.

The minimum amplitude of a current pulse required to bring the phase change material within all memory cells within an array to the material's melting temperature, $T_{MELT}$, may be referred to herein as $I_{RESET}$. The value of this current-pulse amplitude may be determined during manufacturing test or during a built-in self test, for example. Parameter values related to other program states, whether a full SET state or an intermediate state employed in a multi-level cell embodiment, may be similarly determined during manufacturing test, built-in self test, or other means. One or more of such parameter values may be linked to the value of $I_{RESET}$. For example, the amplitude of the SET programming current may be limited to no more than a percentage (e.g. 75%) of $I_{RESET}$.

In an illustrative embodiment a memory in accordance with the principles of the present invention performs a self-test during which it optimizes $I_{RESET}$, setting $I_{RESET}$ to a value equal to that required for the least-readily RESET cell within the array. A margin (5%, 10%, 20%, for example) may be added to the nominal value in order to ensure proper operation over time and throughout an environmental range. In addition to optimizing the value of $I_{RESET}$ in this manner, the upper bound for a non-RESET programming current may also be optimized during a test, such as a factory test or a self test, for example.

A memory that employs narrow programming pulses in accordance with the principles of the present invention may be particularly suitable for operation in a variety of electronic devices, including cellular telephones, radio frequency identification devices (RFID), computers (portable and otherwise), solid state drives (SSDs), location devices (e.g., global positioning system (GPS) devices, particularly those that store and update location-specific information), and handheld electronic devices, including personal digital assistants (PDAs), and entertainment devices, such as MP3 players, for example.

DETAILED DESCRIPTION

Figure 1:
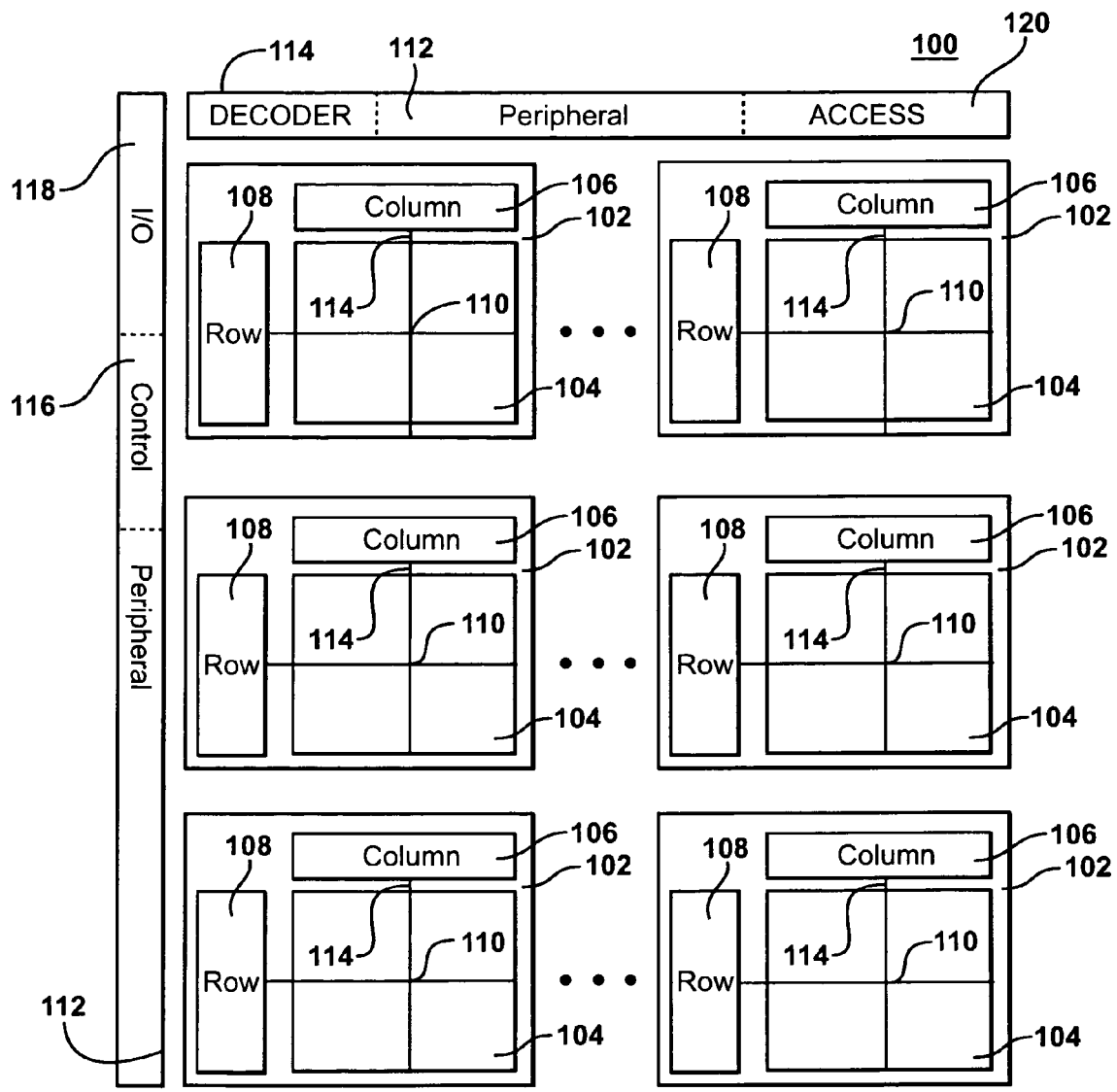
FIG. 1 is a block diagram of a programmable resistance memory array in accordance with the principles of the present invention.

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. The term "memory cell" is primarily used herein in reference to a combination of a memory element (that is, phase change material and associated electrodes) and closely associated circuitry, such as a diode isolation device. However, the terms "memory cell" and "memory circuit" may occasionally be used interchangeably, with the exact meaning being clear from the context in which the term is used. The scope of the invention is defined only by reference to the appended claims.

Phase change memories operate with at least two logic states, referred to as the SET and RESET states. By convention, the SET state corresponds to a lowest resistance, most crystalline phase of the material. The RESET state corresponds to a highest resistance, most amorphous phase, of the material. Other logic states, corresponding to resistance values that are intermediate to the SET and RESET resistances, may be included in the memory's logic scheme.

Typically, the SET operation determines the memory's speed of operation and the RESET operation dictates the minimum size of the memory's access devices. That is, programming a phase change memory cell to the SET state involves raising the temperature of the phase change material above the material's crystallization temperature and holding the material at that temperature for a period of time that is sufficient to crystallize an active volume of the material. Programming a phase change memory cell to the RESET state involves raising the temperature of an active volume of the phase change material above the material's melting temperature, thereby amorphizing the material, then quickly reducing the temperature of the material below the material's crystallization temperature in order to prevent re-crystallization of the material, thereby freezing the material in the amorphous state.

Because the crystallization process is slower than the melting process, SETing a cell typically requires substantially more time (as much as an order of magnitude or more) than RESETing a cell. Because all memory access operations (read, write 00, write 01, etc.) will typically be assigned an equal period of time, the SET operation limits the memory's speed. RESETing a cell, raising the temperature of the phase change material past its crystallization temperature to its melting temperature, requires a higher current level than SETing a cell. Accordingly, the RESET operation's higher current requirement sets the limit on how small the switching devices employed by a phase change memory may be.

Reducing the amplitude of RESET currents and extending the period of a RESET pulse would seem to provide the benefits of a lower RESET current (because the memory may use smaller access devices), without penalty (the RESET pulse can be extended significantly and still remain shorter than the SET pulse). That is, by extending the period of a RESET pulse to a period that is comparable to that of a SET pulse, the amplitude of the RESET pulse may be reduced to a level that permits gradual heating of a cell's phase change material up to the material's melting temperature. By gradually bringing the cell's phase change material up to its melting temperature, a smaller access device may be employed by the memory without any negative impact on the memory's overall access speed because the memory's overall access speed is limited by the slower, SET, operation.

Rather than employing wider RESET pulses, however, a phase change memory in accordance with the principles of the present invention employees narrower RESET pulses. The narrower RESET pulses avoid over-RESETing a phase change memory and, thereby, reduce the time required to SET the device. Because the SET period is the period that limits the overall access speed of a phase change memory, reducing the SET period by employing a narrow RESET pulse in accordance with the principles of the present invention increases the overall access speed of a phase change memory. By avoiding the over-RESET condition a phase change memory in accordance with the principles of the present invention may also improve the endurance (the number of read/write cycles the memory may undergo) of a phase change memory.

Additionally, in accordance with the principles of the present invention a plurality of relatively narrow RESET pulses may be employed to program devices to the RESET state. In accordance with the principles of the present invention, the briefest programming pulses possible are used to RESET a programmable resistance memory cell, such as a phase change memory cell. Although the duration and magnitude of RESET programming pulses in accordance with the principles of the present invention may vary depending, for example, upon the composition and structure of a cell, a method and apparatus in accordance with the principles of the present invention employs the briefest pulse practicable for a given cell. A RESET pulse in accordance with the principles of the present invention rapidly takes the phase change material to its melting temperature and holds it there for the minimum time-at-melt required to achieve the RESET transformation, also referred to herein as the cell's minimal RESET period.

In a multi-pulse narrow-RESET-pulse embodiment, the pulse amplitudes and widths are configured to raise the temperature of an active volume of the least readily amorphized cell within an array to at least the melting temperature of the phase change material for a cumulative time-at-melt substantially equal to the minimal RESET period for the cell. The cumulative time of the plurality of access pulses and of the periods in between pulses in such an embodiment may be substantially equal to the period associated with a SET operation for the same cell. Additionally, the SET period may be substantially equal to the minimum period of time required to crystallize an active volume of phase change material within the least-readily crystallized memory cell within the array.

The conceptual block diagram of FIG. 1 provides a functional level view of an illustrative programmable resistance memory circuit 100 in accordance with the principles of the present invention. In this illustrative embodiment, a programmable resistance memory circuit 100 includes at least one array of programmable resistance memory cells arranged as a storage matrix tile 102, along with peripheral circuitry 112 that, in combination, yields a standalone programmable resistance memory circuit 100. The programmable resistance memory cells of the storage matrix 104 may be implemented as, for example, phase change memory cells.

The memory circuit 100 includes row drivers 108 and column drivers 106 configured to access cells within the storage matrix 104. In accordance with the principles of the present invention, peripheral circuitry 112 includes pulse generating circuitry configured to supply access pulses to a selected programmable resistance memory element. The access pulses may take the form of READ pulses or WRITE pulses. The WRITE pulses may be RESET pulses, SET pulses, or pulses designed to program the selected memory element to values intermediate to the SET and RESET states. Additionally, the access pulses may take the form of current-limited or voltage-limited pulses, referred to herein as current or voltage pulses, respectively.

Accesses carried out by the row 108 and column 106 drivers include reading from the memory cells of the matrix 104 and writing to the memory cells of the matrix 104. Peripheral circuitry 112 includes decoding circuitry 114 which accepts address signals from another electronic device, such as a controller, for example, and decodes the address signals to determine which of the row 108 and column 106 drivers to activate and, thereby, which of the memory cells within the array 104 to access. Access circuitry 120, including pulse generating circuitry, is described in greater detail in the discussion related to FIG. 2. Details of the pulses generated by the circuitry 120 are discussed in greater detail in the discussion related to FIGS. 4A, 4B, 5A, and 5B. Control signals developed for the memory 100 may include data direction control information (e.g., READ "from" or WRITE "to" the storage matrix tile 102) and may include storage level control information (e.g., WRITE 00, 01, 10, or 11).

Figure 2:
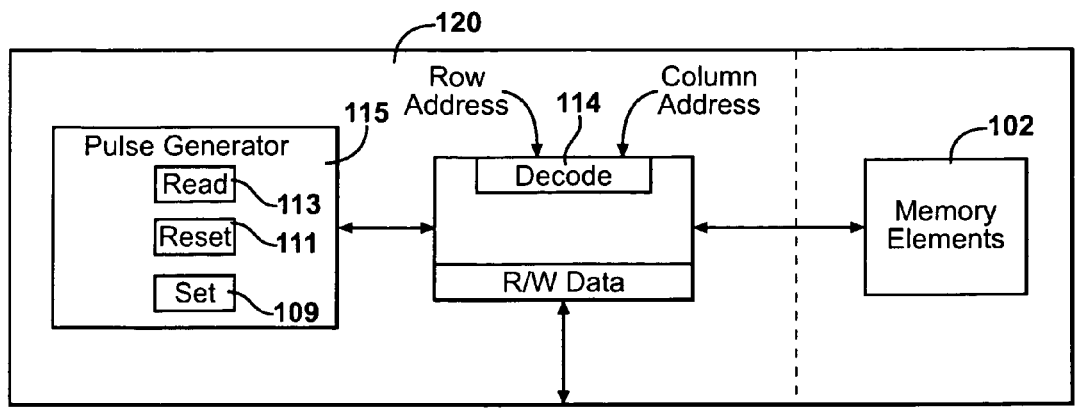
FIG. 2 is a more detailed block diagram of peripheral circuitry such as may be employed by a phase change memory in accordance with the principles of the present invention.

The block diagram of FIG. 2 provides a more detailed view of access circuitry 120 which forms a part of a programmable resistance memory in accordance with the principles of the present invention. In the illustrative embodiment of FIG. 2 the memory array 100 includes memory access circuitry 120 configured to write data to and read data from a phase-change memory elements 104. Phase change memory arrays are known and may be organized, for example, as hierarchical memories. The memory array 104 may include phase change memory cells arranged in a two dimensional matrix, with row (also referred to as wordline) and column (also referred to as bitline) decoder and driver transistor devices and row and column interconnect conductors, for example, as described in the discussion related to FIG. 1. Phase change memory arrays are known and discussed, for example, in U.S. Pat. No. 6,813, 177 issued to Lowrey et al, which is hereby incorporated by reference.

The access circuitry 120 includes address, data, and read/write decode circuitry that determines, in response to input from circuitry accessing the memory, what operation (i.e. READ, SET, RESET). is to be performed upon what cell within the memory 104 and, if a multi-level WRITE operation is to be performed, what data is to be written into the phase change cell. In embedded memory applications within the scope of the invention, the memory array 104 and access circuitry 102 may be formed on the same die, adjacent other circuitry, such as a controller that may be embodied as a microprocessor, for example.

In this illustrative embodiment of a phase-change memory in accordance with the principles of the present invention, the access circuitry 120 includes a pulse generator 115 that includes SET pulse circuitry 109, READ circuitry 113, and RESET pulse circuitry 111. The SET pulse circuitry 109 is configured to provide one or more narrow pulse (or pulses) that will SET an addressed phase change cell within the memory array 104. READ circuitry 113 includes circuitry, such as sense amplifiers, for example, that allows the READ circuitry to assess the logic state of an addressed memory cell within the memory array 104. The RESET circuitry is configured to provide one or more narrow pulses to RESET an addressed memory cell within the memory array 104 and to thereby RESET the memory cell.

In operation, a series resistance between the programming pulse source and the memory cell may be configured to allow the programming voltage pulses to supply sufficient current to the cell to program the cell. That is, the series resistance is configured so that the minimum target threshold voltage supplies enough current to program a phase change memory cell. The series resistance may include the line resistance of an array's interconnect (e.g. the column line resistance between the programming pulse source and a memory cell to be programmed) and the contact resistance of the memory cell, for example.

The pulse generator 115 may include current sources that are switched in or out of the memory's addressing path or one or more current sources may be located "off-chip." By "off-chip" we mean circuitry that is physically separate from the integrated circuit that forms the memory. In an embodiment in which current sources are located off-chip, a memory in accordance with the principles of the present invention may include input circuitry configured to receive and distribute current from the off-chip current sources. As previously indicated the pulse generator may generate pulses that are current-limited or voltage limited. For the sake of clarity, discussions related to the pulse generator will, generally, be in terms of current pulses, but, as previously indicated, voltage pulses are contemplated within the scope of the invention.

Current sources employed by the pulse generator 115 may include dedicated sources: one for READ and one for each logic level, or a single source may be employed for all operations. The capacity of each current source may be such that it is just sufficient to meet the maximum requirements of its associated read or write function or, particularly in the case of a single current source embodiment, the current source may feature a capacity that is sufficient to meet the maximum requirements of all the read and write operations. As will be described in greater detail in the discussion related to the following Figures, a memory in accordance with the principles of the present invention may, take advantage of test results (which could be "on-chip" built in self tests, tests conducted under external control, or a combination) to optimize operation of the memory by employing results of such tests to set the amplitude or width of programming pulses, as will be described in greater detail in the discussion related to the following Figures.

Figure 3:
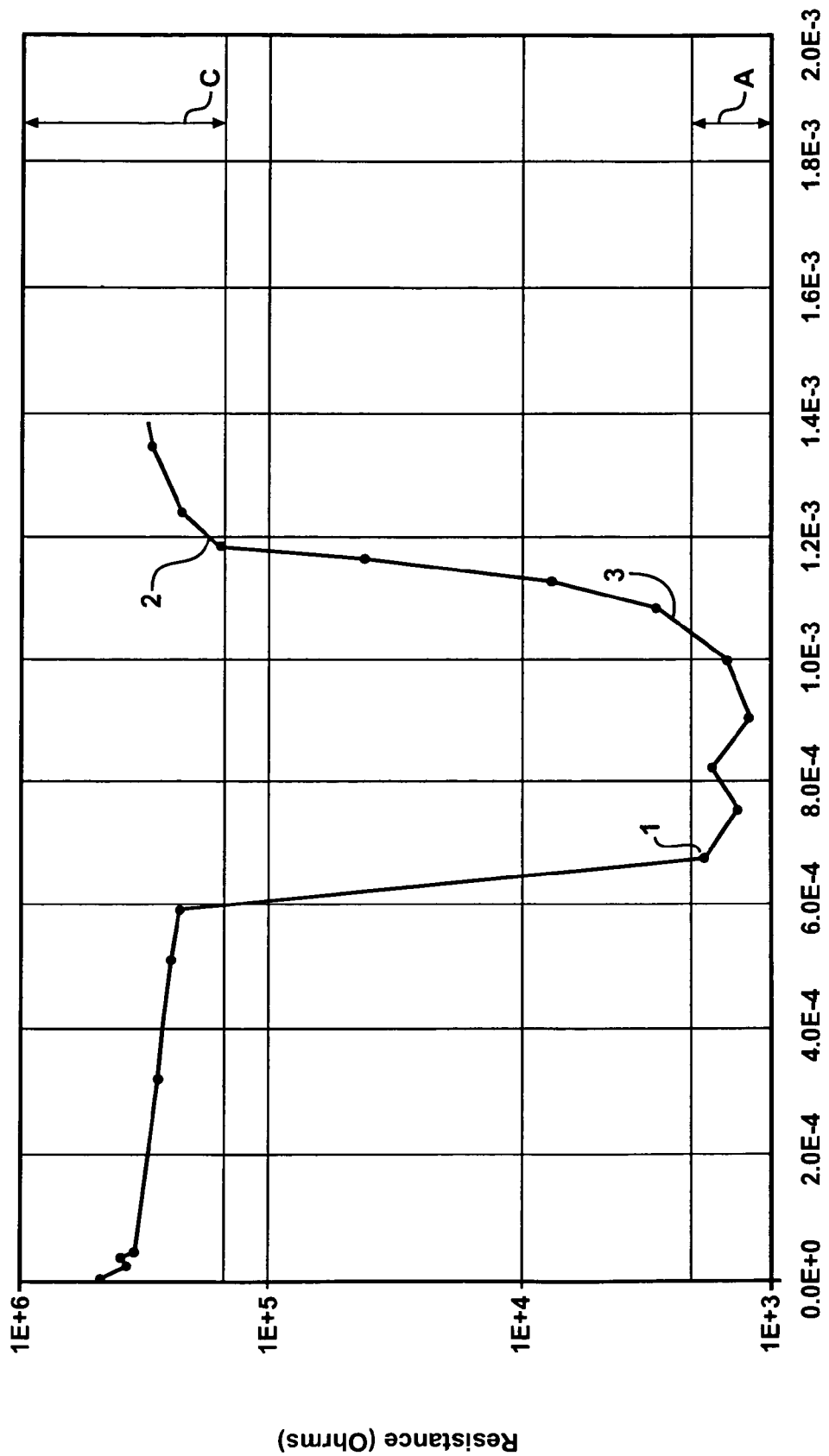
FIG. 3 is a current/resistance plot depicting programming features as addressed by a phase change memory in accordance with the principles of the present invention.

The graph of FIG. 3 is a plot of resistance versus programming current for a typical phase change memory cell. This representation is used for illustrative purposes only; the resistance and current values are only included to provide an illustration of general response trends and to clarify the use of terminology employed in the discussion related to this and other Figures disclosed herein. In this illustrative embodiment a phase change memory cells is initially programmed to the RESET state as indicated by the high resistance the cell exhibits (approximately 7 MΩ). Applying a programming pulse having an amplitude of less than 600 micro-amps to the cell has little effect on the resistance and, correspondingly, the programmed state of the memory cell. Applying a programming pulse of slightly greater amplitude, of approximately 650 micro-amps, dramatically alters the resistance of the memory cell, dropping the resistance to approximately 3 kΩ. This low-resistance state is referred to as the SET state and corresponds to the crystal phase of the phase change material. As indicated by the span between 650 μA and 1 mA, increasing the magnitude of a programming pulse has little effect on the resistance of a SET memory in this current range; the current amplitude is not great enough to cause the phase change material to melt. As the magnitude of the programming pulses increase beyond 1 milliamp, the resistance of the memory element abruptly increases until, at a programming-pulse amplitude of approximately 1.2 milliamps, the resistance of the memory element once again approaches that of the RESET state (point 2), with more gradual increases in resistance associated with higher amplitude programming pulses beyond that point.

Beyond these qualitative descriptions, we can define the SET state of a memory element, represented by band A in FIG. 3, as a state in which the memory element exhibits a resistance that is within 100% of the minimum resistance of a memory element of a specific type at a given environmental setting (e.g., drift-free at 20° C.). Additionally, we define the beginning of a transition from a SET state to a RESET state, represented by point 3 in FIG. 3, as the point at which the resistance of a memory element increases by 100% over the mid-band SET value in response to the application of a programming pulse. Similarly, we can define the RESET state of a memory element, represented by band C in FIG. 3, as a state in which the memory element exhibits a resistance that is no less than 90% of the maximum resistance exhibited by a memory element of a specific type at a given environmental setting.

Figure 4A:
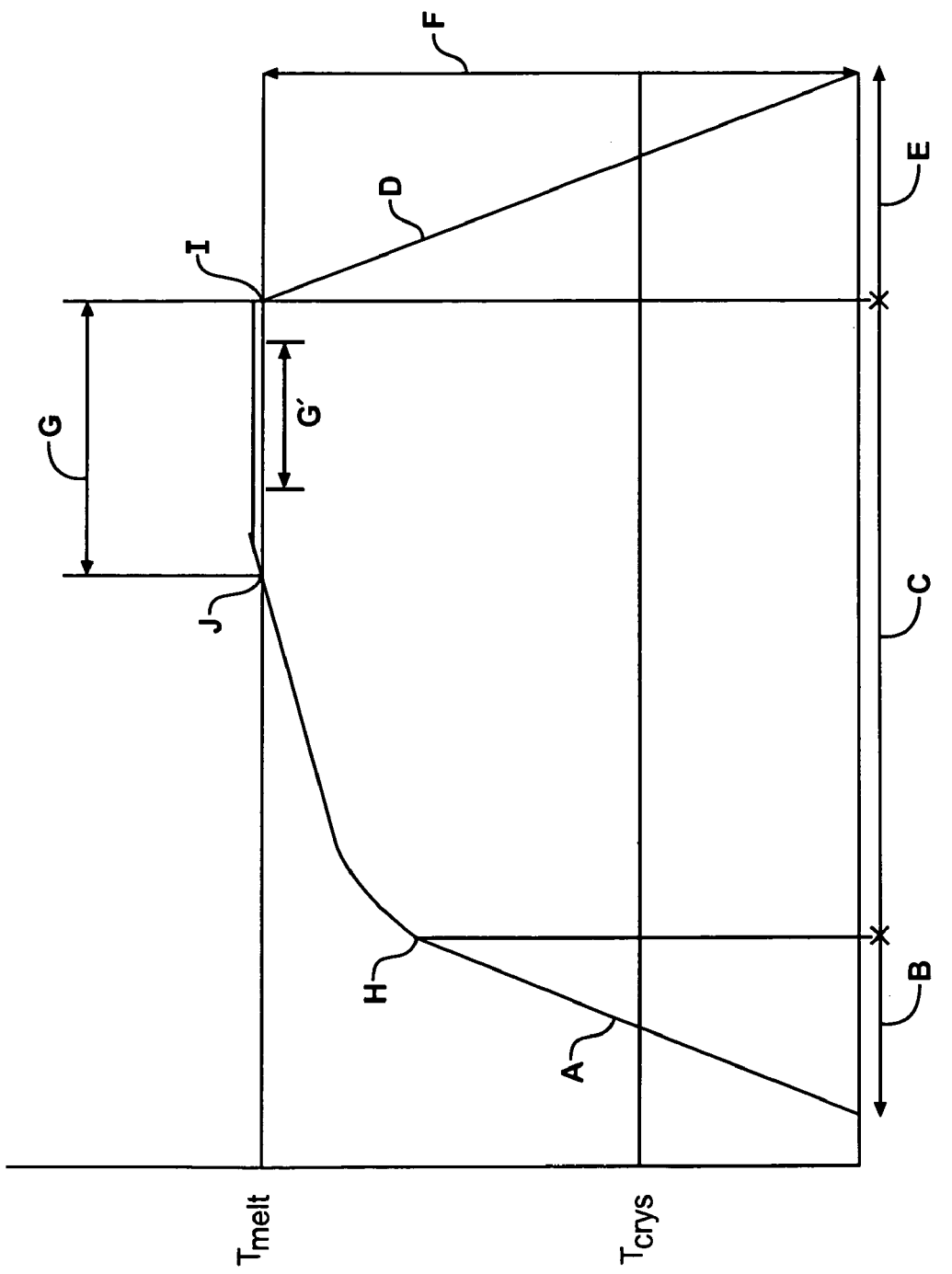
FIGS. 4A and 4B are graphical illustrations of features of programming pulses in accordance with the principles of the present invention.
Figure 4B:
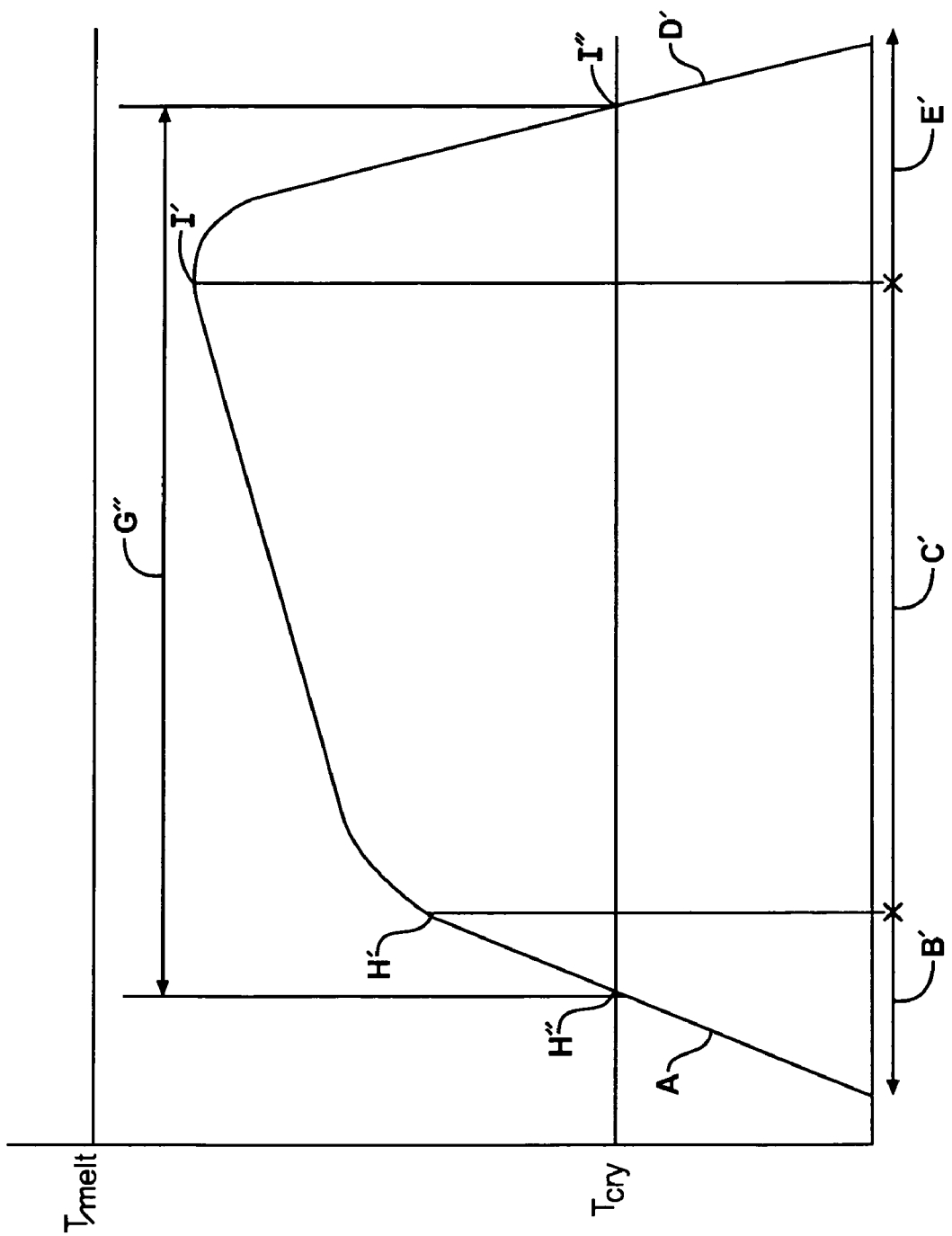

The graphical representations of FIGS. 4A and 4B respectively depict RESET and SET programming pulses in accordance with the principles of the present invention. As previously indicated, such pulses may be voltage-limited or current-limited, for example, but will be generally referred to herein as a current pulse.

In the illustrative example of FIG. 4A, the temperature of an active volume of phase change material within a phase change memory element is plotted along the ordinate, time is plotted along the abscissa, the ordinate is fixed at a time just prior to the application of a programming pulse, and the temperature at the origin is at an ambient temperature. In this graphical illustration, temperature is used as a proxy for current. Although the temperature of the phase change material within an active volume of a memory cell will lag the applied current, the use of temperature as a proxy for current is adequately accurate for our illustrative purposes.

The RESET programming pulse of FIG. 4A may be described in terms of such parameters as a rising edge A, rising edge period B, a plateau period C, a falling edge D, falling edge period E, pulse height F, pulse width (B+C+E), time-at-melt period G, melt temperature $T_{melt}$ and crystallization temperature $T_{CRYS}$. The end of the rising edge H is defined as the point on the rising edge of the pulse where the rate at which the temperature within the phase change memory increases begins to decrease. The beginning of the falling edge I is defined as the point where the amplitude of the pulse begins to decline. As previously noted, the period C between points H and I is defined as the plateau period.

In an illustrative, single-pulse RESET programming method and apparatus in accordance with the principles of the present invention, a minimal-width RESET pulse is employed to RESET a phase change memory cell. By minimal-width RESET pulse, we mean a pulse having a width that is substantially equal to the minimal time-at-melt temperature required to RESET a cell. As described in greater detail in the discussion related to the following Figures, a minimal-width RESET pulse may include, in addition to the minimal-time-at-melt period, time associated with a rising edge, time associated with a falling edge, and time associated with a cell-variation margin. In such a pulse, the plateau period C may be substantially equal to the time-at-melt period G. The time associated with a cell variation margin accommodates the variation in response to RESET programming pulses among memory cells within a memory array. Such response variation may be due to variation in thermal, structural, or electrical properties of the memory cells and/or due to variations among the drivers that produce the programming pulses.

As indicated in the plot of FIG. 4A, a programming pulse may rapidly increase the temperature of phase change material within a phase change memory up to a point (point H), referred to herein as the end of the rising edge, then, with continued application of a steady programming current, the material continues to heat up at a slower pace until the phase change memory cell reaches a thermal equilibrium. In the illustrative example of FIG. 4A, the cell eventually reaches the melting temperature of its phase change memory material at point J. The time-at-melt period G, during which the material within the cell is at its melting temperature, determines the degree to which the cell is RESET. As will be described in greater detail below, a cell may become over RESET if the time-at-melt period G is too great.

The thermal response of memory cells within an array may vary significantly from cell to cell. For example, the temperature profile of one cell may correspond to a somewhat intermediate response, such as illustrated by the graph of FIG. 4A. In such a case, an applied current pulse is sufficient to rapidly bring the phase change material within the cell to an elevated temperature that is somewhat less than the melting temperature of the material and, with continued application of the current, the material rises to its melting temperature for a period G. Another cell may respond to the same current pulse by rising to the phase change material's melting temperature almost immediately, in which case the end of the rising edge H and the point at which the material reaches its melting point J may substantially coincide and the period of time G during which the material is at its melting temperature is approximately co-extensive with the cell's plateau period C. Another cell may respond with a temperature profile in which its rising edge terminates (H) at a temperature that is substantially below the melting temperature. $T_{melt}$ of the material. Continued application of current may gradually raise the temperature of the material toward its melting temperature, but the temperature may never rise to its melting temperature or may, for example, reach the material's melting temperature at the beginning of the temperature profile's falling edge (point I), resulting in a profile where the time-at-melt, G, is zero. Such a profile corresponds to a cell that is not RESET by the programming pulse.

For a given pulse-width, a minimum-amplitude RESET current pulse $I_{RESET}$ may be defined as a pulse having sufficient amplitude to raise an active volume of the phase change material within a memory cell to the material's melting temperature for a time-at-melt period G sufficient to raise the resistance of the material to the cell's RESET resistance (consistent with the definition provided in the discussion related to FIG. 3). For an array of memory cells, that definition applies to the least-readily amorphized cell within the array. That is, $I_{RESET}$ is the lowest-amplitude RESET pulse at a given pulse-width that will raise the temperature of phase-change material within the least-readily amorphized cell to the phase change material of the cell's melting temperature for a sufficient period of time to raise the resistance of the cell to no less than 90% of the maximum value exhibited by such cells at ambient conditions.

The temperature profile of a memory cell having $I_{RESET}$ applied may be like that of FIG. 4A, with the applied current inducing a rapid temperature increase up to point H, after which the temperature of the phase change material increases more gradually, until the temperature reaches the melting temperature at point I. The time-at-melting period G extends for a period of time that is just sufficient to raise the resistance of the phase change memory cell to at least 90% of the maximum resistance value of the cell. A lower-amplitude programming current wouldn't raise the temperature of the material to the melting point long enough (time-at-melting-temperature period G) for the material to reach the RESET resistance. Because this temperature profile is associated with the least-readily amorphized cell within a memory array, other cells within the array will respond to an identical programming pulse by rising to the material's melt temperature more quickly, thereby extending the time-at-melting-temperature period G.

Typically, the amplitude of a RESET current pulse is adjusted to ensure that all cells within an array receive sufficient current to properly RESET, but the width of the pulse is ignored. A phase change memory cell may be particularly sensitive to adjustments in programming current; a relatively small adjustment in current amplitude may have a relatively large impact on a cell's time-at-melt. For example, in FIG. 4A a minor increase in current amplitude could raise the end of the rising edge H to the material's melting temperature, yielding a time-at-melt period G that is more than double the period illustrated. Such an increase in the material's time-at-melt can have deleterious effects, such as over-RESETing the cell or limiting the number of cycles a cell may operate (that is, limiting the endurance of the cell).

The conventional approach to RESETing phase change memory cells is to provide a current pulse of sufficient magnitude ensure that the least readily amorphized cell within the array is RESET, with little or no attention being paid to the duration of the RESET pulse. Heretofore, little attention has been paid to the duration of RESET pulses in part because the duration of the SET pulse, typically considerably longer than a RESET pulse, has been the parameter that limits a phase change memory's operational speed. Additionally, it was not recognized until now that the cells may actually be over-RESET by too-lengthy RESET pulses. Recognizing that memory cells RESET using shorter RESET pulses render cells that are more readily SET, a memory in accordance with the principles of the present invention employs RESET pulses that raise the temperature of the phase change memory in a cell to the material's melting point for a period that is substantially equal to the minimum time-at-melt period required to RESET the cell.

In one aspect of the invention a phase change memory in accordance with the principles of the present invention employs a RESET programming pulse that raises the temperature of the least-readily amorphized cell within an array to the phase change material's melting temperature as rapidly as possible, holds the material at that temperature for a period of time sufficient to melt an active volume of the phase change material but not so long as to allow over-RESETing, and reduces the temperature of the phase change material past its crystallization temperature as rapidly as possible.

In various embodiments, this means that a programming pulse in accordance with the principles of the present invention raises the temperature of such a cell to the phase change material's melting point within less than 5 ns, 3 ns, 1 ns or 500 ps. The rapidity of temperature increase may also be expressed as a percentage of the minimum time-at-melt required to RESET the cell, with the rising edge period B no more than 50%, 25%, 10%, or 1% of the minimum time-at-melt period. Similarly, the falling edge period may be less than 5 ns, 3 ns, 1 ns or 500 ps. Expressed as a percentage of the minimum time-at-melt required to RESET the cell, the falling edge period E may be no more than 50%, 25%, 10%, or 1% of the minimum time-at-melt period.

In another aspect of a programming pulse in accordance with the principles of the present invention, the point I at which the falling edge of the programming pulse commences yields a time-at-melting-temperature period G that is no more than 10 ns, 5 ns, 2 ns, 1 ns, or 500 ps longer than the minimum time-at-melt period G' required to program the least-readily amorphized cell within an array to the RESET state. Expressed in terms of a percentage of the minimum time-at-melt period, the time-at-melt produced by a RESET pulse in accordance with the principles of the present invention may be no more than 300%, 200%, 150%, or 125% of the minimum time-at-melt period for a cell. The overall pulse-width (B+C+E) of a RESET pulse in accordance with the principles of the present invention may be less than 10 ns or 5 ns, with a falling edge period E less than 3 ns, 1 ns, or 500 ps and similar rising edge period.

In an illustrative embodiment the amplitude of RESET programming pulses is set to a magnitude that raises the temperature of a programmed volume of phase change material within the cell to the phase change material's melting point within a period of time no greater than 5% of the RESET pulse's overall duration (B+C+E). The RESET pulse's overall duration (B+C+E) may be set to no greater than 20% of the duration of a corresponding SET pulse employed to SET the cell. In such an embodiment, the "time-to-melt" (that is, the time between the initiation of the RESET pulse and the time the phase change material melts), may be no more than ions, preferably no more than 1 ns, and more preferably no more than 500 ps.

In another illustrative embodiment in accordance with the principles of the present invention, the amplitude of RESET programming pulses may be set to a value that raises the temperature of a programmed volume of phase change material within the cell to the phase change material's melting point $T_{melt}$ within a period that is substantially equal to the electrical time constant of the cell. By substantially "equal to the electrical time constant of the cell", we mean no more than 500 ps to 5 ns more than the electrical time constant of the cell. The value for the electrical time constant of the cell may be chosen as the time constant associated with the worst-case line-capacitance and memory-cell resistance of any cell within the array, for example.

In accordance with the principles of the invention the amplitude of the RESET pulse may be selected to avoid over-RESETing the most readily amorphized cell within the memory array. A memory in accordance with the principles of the present invention may employ multiple RESET pulses, each of which is of sufficient magnitude to rapidly raise the phase change material within a memory cell to the material's melting temperature, but is of insufficient duration to completely RESET the cell. The use of multiple short-duration RESET pulses in accordance with the principles of the present invention is described in greater detail below.

The SET programming pulse of FIG. 4B may be described in terms of a rising edge A', rising edge period B', a plateau period C', a falling edge D', falling edge period E', pulse height F', pulse width (B'+C'+E'), time-at-crystallization period G", melt temperature $T_{melt}$ and crystallization temperature $T_{cry}$. The end of the rising edge H' is defined as the point on the rising edge of the pulse where the rate at which the temperature within the phase change memory increases begins to decrease. The beginning of the falling edge I' is defined as the point where the amplitude of the pulse begins to decline. The period between points H' and I' is defined as the plateau period C'.

In this illustrative embodiment, the peak temperature I' elicited by a SET programming pulse is lower than the melting temperature $T_{melt}$ of the phase change material. A SET programming pulse that raises the temperature of the phase change material to it's melting temperature may be employed in alternative embodiments. In particular, a programming pulse, commonly referred to as a SET sweep programming pulse, may be employed in accordance with the principles of the present invention. Whether using a SET programming pulse such as that illustrated in FIG. 4B, a SET sweep programming pulse, or other type of SET programming scheme, a memory in accordance with the principles of the present invention may employ a minimal-width RESET pulse to RESET a memory cell, as described in greater detail in the discussion related to FIG. 4A.

Typically, the process of amorphizing phase change material (RESETing the memory element) can be carried out much more rapidly than the process of crystallizing the material (SETing the memory element). As a result, the SET process typically dictates a memory array's access speed; the same time will be allotted to writing a 0 to a cell as will be allotted to writing a 1 to the cell. In accordance with the principles of the present invention, a plurality of sub-minimal-width RESET pulses may be employed to RESET a phase change memory, with the total time allotted to the multiple pulses less than or equal to the time allotted to SETing the phase change memory. In such embodiments each of the sub-minimal-width RESET pulses raises the temperature of the phase change material to the material's melting temperature for a period of time that is less than the time required to fully RESET a cell. By applying a series of pulses, each of which is of insufficient duration to RESET the memory element, a memory in accordance with the principles of the present invention gradually RESETs the memory element over a span of pulses.

In an illustrative embodiment of a memory in accordance with the principles of the present invention, the cumulative time-at-melt for all the applied sub-minimal-width RESET pulses is substantially equal to the minimal-time-at-melt required to RESET the memory element. That is, using a single-pulse RESET approach in accordance with the principles of the present invention, a minimal-width RESET pulse raises the temperature of the phase change material to the material's melting point for a sufficient period of time to amorphize an active volume of the material. Time margin associated with rising and falling edges and with cell response variation may be added to the minimum-time-at-melt for the RESET operation. In other words, the minimum-time-at-melt figure may be expanded to accommodate variations in thermal, structural, and switching element characteristics among the memory cells within an array. In an illustrative multi-pulse RESET embodiment, a plurality of RESET pulses, none of which are of sufficient duration to RESET a memory element, are applied to a memory and the cumulative effective of the series of pulses RESETs the memory element. Such pulses may also be referred to herein as sub-minimal-time-at-melt RESET pulses or, simply, sub-minimal RESET pulses.

The entirety of the RESET pulse stream applied in this manner may fall within a period that is less than or equal to the period of time required to SET the memory. The duty cycle of a sub-minimal RESET pulse train in accordance with the principles of the present invention may be selected to prevent over-RESETing a memory element. That is, sufficient time may be allotted between the sub-minimal RESET pulses in a string to allow the temperature of the phase change material to drop below the material's melting temperature $T_{melt}$ and to ensure that the material's cumulative time-at-melt is insufficient to over-RESET the memory. An appropriate duty cycle may be determined empirically, using a built-in-self-test, for example, as with other programming parameters. In various embodiments, the duty cycle of a sub-minimal RESET pulse stream may vary from 10% to 90% at the material's melting temperature.

In an illustrative embodiment, the cumulative time-at-melt of a series of sub-minimal RESET pulses is substantially equal to the memory element's minimal RESET time-at-melt period. When we say that the cumulative time-at-melt is substantially equal to the minimal RESET time-at-melt period, we mean that the cumulative time-at-melt does not exceed the minimal RESET time-at-melt period by more than 10 ns, 5 ns, 2 ns, ins, or, preferably, 500 ps. Expressed in terms of a percentage of the minimum time-at-melt period, the cumulative time-at-melt produced by a sub-minimal RESET pulse string in accordance with the principles of the present invention may be no more than 300%, 200%, 150%, or 125% of the minimum time-at-melt period for a cell. As with single-pulse RESETing, a multi-pulse RESET method in accordance with the principles of the present invention employs RESET pulses that rapidly raise the temperature of a memory cell's phase change material to the material's melting point then rapidly quenches the material after melting. In an illustrative embodiment, the rising edge and falling edge of each of the pulses within a pulse stream adhere to the time-limits previously described in the discussion related to single-pulse RESETing.

One of the advantages of using short-pulse RESET programming in accordance with the principles of the present invention is that such an approach tends to reduce or eliminate the number of memory cells that are over-RESET. As previously described, the phenomenon of over-RESETing is one whereby the SET operation of a phase-change memory is negatively affected by a RESET operation. In particular, the time required to SET an over-RESET device is increased relative to the time required to SET the same device when it has not been over-RESET. Although the over-RESETing is not well understood, this inventor believes that a RESET pulse that applies power to a memory element that is amorphized for an extended period of time may reduce the number of nucleation sites within an active volume of the memory element's phase change material and/or melt too large a volume of phase change material, thereby delaying the onset of crystallization in a subsequent SET operation. By employing extremely short RESET pulses in accordance with the principles of the present invention, the instant RESETing method avoids over-RESETing phase change memory elements.

Although the over-RESET phenomenon is, to some extent, a matter of degree, for the purposes of this discussion we define the over-RESET condition as one in which, after having been RESET, a memory element requires a SET period of at least an additional 10% over a baseline SET period. By "baseline SET period" we mean the time required to SET the memory element to within 10% of its nominal minimum value using the identical SET programming method. Consequently, one baseline SET period may be associated with a square programming pulse of a specific magnitude, another baseline SET period may be associated with a SET sweep programming pulse having a specific trailing edge rate, and other baseline SET periods may be associated with other SET programming methods. Each SET programming method will have a baseline period associated with it and the measure of whether a memory is over-RESET or not is whether that baseline period has been extended by at least 10%, absent the contribution of any other factors, such as environmental factors. The inventor believes that, in addition to reducing a memory's SET speed, the continued application of power to a RESET memory element, over-RESETing a memory element, may also contribute to the deterioration of a memory element. Such deterioration may be manifested in the memory element's reduced endurance (that is, reduced number of times the device may be accessed), or reduced retention capability, for example.

In accordance with the principles of the present invention, the use of minimal-width RESET pulses or sub-minimal-width RESET pulse strings may be accompanied by a process whereby appropriate RESET pulse durations and amplitudes are determined empirically or through simulation. Such an empirical process may take place during manufacturing test or during a memory self-test, for example. A memory in accordance with the principles of the present invention may include built-in self-test circuitry that may operate in standalone fashion or in conjunction with off-chip facilities, such as manufacturing test equipment. Such circuitry may be used to determine the appropriate amplitude and width for RESET pulses in accordance with the principles of the present invention.

The value of $I_{RESET}$ and the minimal time-at-melt required to RESET a memory element may be determined during a self-test and stored within a memory in accordance with the principles of the present invention. The $I_{RESET}$ and minimal-time-at-melt results may then be used by the memory to set the amplitude and width of RESET programming pulses in accordance with the principles of the present invention. A single minimal-width RESET pulse in accordance with the principles of the present invention would be substantially equal in duration to the minimal-time-at-melt period thus-determined; each of the N pulses in a series of sub-minimal width RESET pulses may be substantially equal in duration to (1/N) (minimal-time-at-melt period). Parameter values related to other program states, whether a full SET state or an intermediate state employed in a multi-level cell embodiment, may be similarly determined during manufacturing test, built-in self test, or other means. One or more of such parameter values may be related to the value of $I_{RESET}$. For example, the amplitude of the SET programming current may be limited to no more than a percentage (e.g. 75%) of $I_{RESET}$.

Figure 5A:
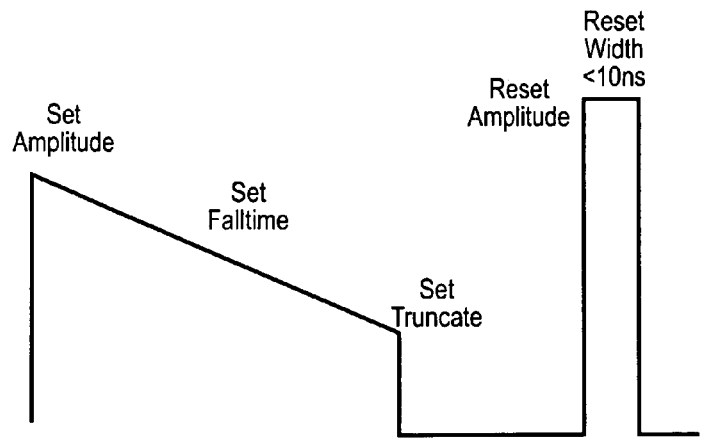
FIGS. 5A and 5B illustrate features of SET and RESET programming pulses in accordance with the principles of the present invention.
Figure 5B:
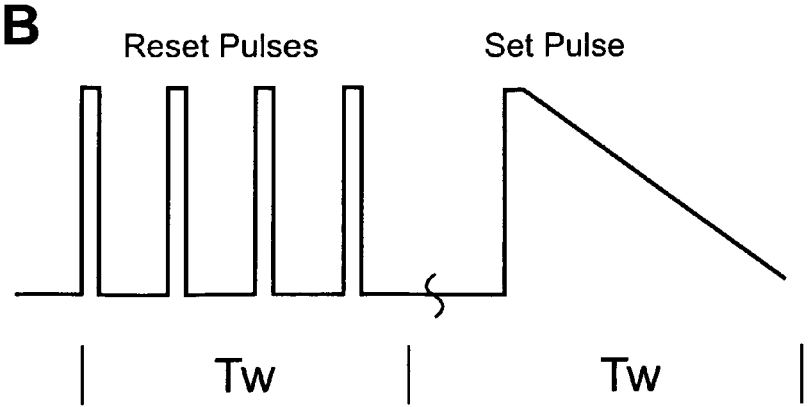

FIGS. 5A and 5B provide a comparison of single minimal-width RESET, multiple sub-minimal-width RESET, and SET programming pulses in accordance with the principles of the present invention. Because FIGS. 5A and 5B are used to primarily to illustrate the differences between the minimal-width and multiple sub-minimal-width RESET pulse operations in accordance with the principles of the present invention, pulse details such as described in the discussion related to FIGS. 4A and 4B (e.g., rise time, fall time, etc.) are not included in the FIGS. 5A and 5B. The RESET pulse of FIG. 5A is a minimal-width RESET pulse of less than 10 ns duration. The corresponding SET pulse, a SET sweep pulse in this illustrative embodiment, features a peak amplitude less than that of the RESET pulse. FIG. 5B illustrates a multi-pulse RESET operation in accordance with the principles of the present invention. As described in the discussion related to FIGS. 4A and 4B, each of the RESET pulses is of a duration that is insufficient to RESET a memory cell, but is of sufficient magnitude to increase the resistance of a memory element (that is, partially RESET the memory element). In this illustrative embodiment the peak amplitude of the corresponding SET sweep pulse is equal to the amplitude of the RESET pulses, but that needn't be the case. As previously described, the total width $T_W$ of the SET pulse may serve as an upper limit on the duration of the RESET pulse string. In such an embodiment, the amplitude and duration of the sub-minimal-width RESET pulses may be configured to raise the resistance of the memory cell 1/N of the total RESET resistance, where N is the number of RESET pulses within a string.

Figure 6:
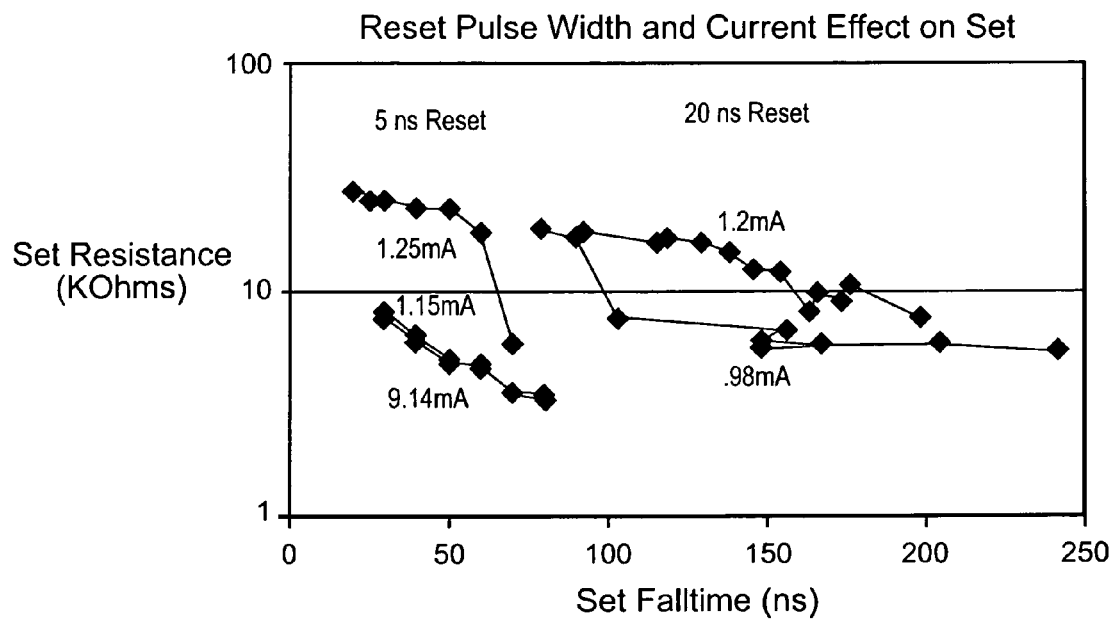
FIG. 6 is a plot of experimental results related to SET resistance versus SET period for a cell that has previously been RESET using either a narrow RESET programming pulse in accordance with the principles of the present invention or using a broader RESET pulse-width.

The test results displayed in FIG. 6 illustrate one of the advantages of using RESET pulses in accordance with the principles of the present invention. The SET fall times of a memory cell are plotted versus the resulting resistance of the cell, demonstrating the correlation between the width of a RESET pulse and the resulting SET speed. As indicated by the plotted results, a very narrow RESET pulse in accordance with the principles of the present invention yields a RESET cell that is much more readily SET than a cell that has been RESET with a wider pulse. The results plotted in FIG. 6 were obtained using 5 ns RESET pulses and 20 ns RESET pulses. After being RESET using either a 5 or 20 ns RESET pulse the memory cell was SET. SETing a cell that was RESET using the longer, 20 ns, RESET pulse required substantially more time than SETing a cell that was RESET using a short, 5 ns, RESET pulse in accordance with the principles of the present invention. These results demonstrate a correlation between RESET pulse width and the over-RESET condition.

One advantage of using a short RESET pulse in accordance with the principles of the present invention, a shorter corresponding SET pulse duration, is clearly demonstrated by the data of FIG. 6. A cell that had been RESET using a 1.2 mA, 20 ns RESET pulse required a 200 ns SET pulse to reach approximately the same SET resistance value reached in only 70 ns by a cell that had been RESET using a 1.25 mA, 5 ns pulse. Similar results obtain for different RESET pulse amplitudes. Because the SET pulse width typically limits a phase change memory's speed of operation, employing minimal-width RESET pulses in accordance with the principles of the present invention has the unexpected effect of increasing SET speed and, indirectly, increasing a phase change memory's speed of operation. That is, changing a parameter that does not limit the memory's speed has the unexpected effect of altering a parameter that does limit the memory's speed and thereby accelerating the memory's operation.

Figure 7:
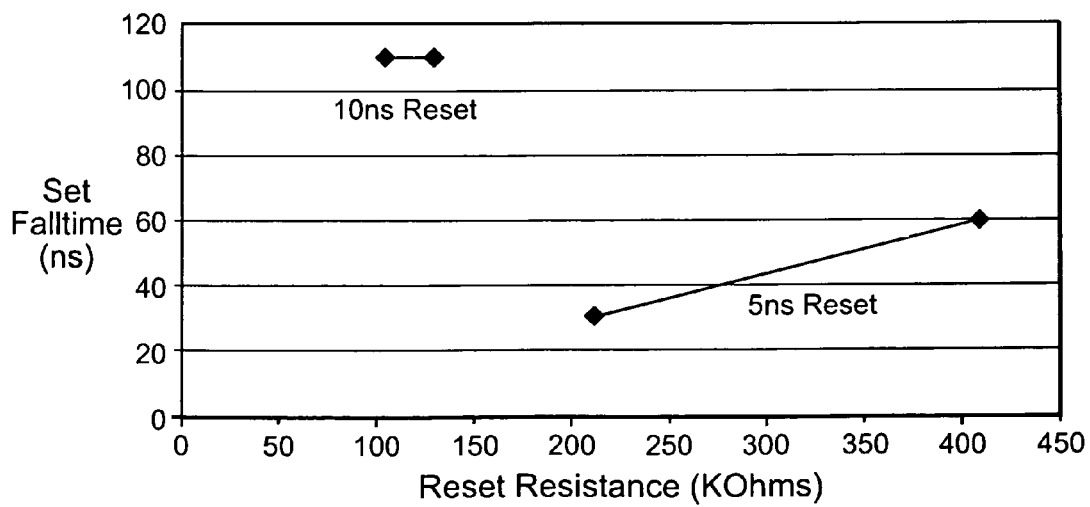
FIG. 7 is a plot of experimental results related to SET periods versus RESET resistance values for a cell that has previously been RESET using either a narrow RESET programming pulse in accordance with the principles of the present invention or using a broader RESET pulse-width.

The graph of FIG. 7 plots test results that further demonstrate the SET speed advantage obtained by employing a minimal-width RESET pulse in accordance with the principles of the present invention. Cells that have been RESET using 5 ns RESET pulses that yield RESET resistances of 200 kΩ to 400 kΩ require from 30 to 60 ns to SET, while cells that have been RESET using 10 ns RESET pulses that yield resistances of 100 to 150 require approximately 110 ns to SET. These results further support the contention that minimal-width RESET pulses in accordance with the principles of the present invention avoid over-RESETing phase change memory cells.

In an illustrative embodiment a memory in accordance with the principles of the present invention performs a self-test during which it optimizes $I_{RESET}$, setting $I_{RESET}$ to a value equal to that required for the least-readily RESET cell within the array. A margin (5%, 10%, 20%, for example) may be added to the nominal value in order to ensure proper operation over time and throughout an environmental range. In addition to optimizing the value of $I_{RESET}$ in this manner, the upper bound for a non-RESET programming current may also be optimized during a test, such as a factory test or a self test, for example.

To accommodate the programming characteristics of a variety of memory cells, a programming circuit in accordance with the principles of the present invention ensures that all cells within an array are programmed to the RESET state by ensuring that the least-readily RESETable memory cell receives sufficient current to melt an active volume of the phase change material within the cell by raising the material to its melting temperature a period substantially equal to the minimal-time-at-melt period.

The value of $I_{RESET}$, associated current values, and margins, may be chosen on a lot by lot basis, for example, by testing sample devices within a manufacturing lot and storing the resultant values within all memory devices in a manufacturing lot for use by a memory in accordance with the principles of the present invention. Narrower margins, and higher performance, may be obtained by testing individual programmable resistance memories during the manufacturing process and storing program-current-related parameters for each device. Such manufacturing test may be, to varying degrees, initiated and performed by testers external to the memory devices itself, with on-chip built in self test circuitry supplementing the operation of the external tester, for example. Such self-tests may be performed in response to external stimuli such as an operating system or memory controller command or input from a user, for example.

In another aspect of the invention, built in self tests may be conducted to regularly update programming pulse parameter values, such as $I_{RESET}$ or minimal pulse width, for example. Determination of such values may be performed during a power-on sequence or during scheduled "down time," for example. By regularly updating such parameter values, access pulse circuitry may be adjusted according to aging and environmental factors to optimize operation of a programmable resistance memory in accordance with the principles of the present invention.

Figure 8:
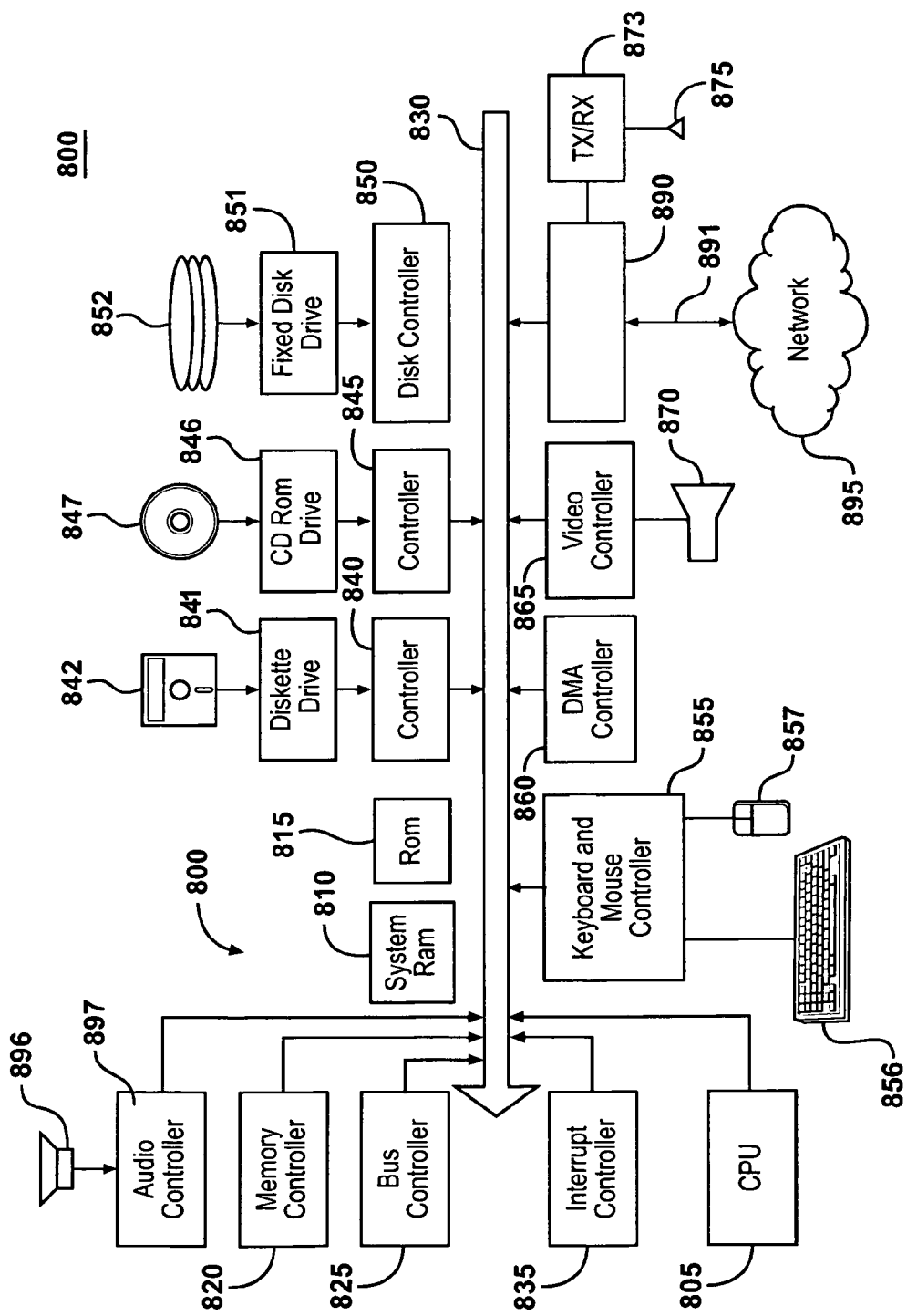
FIG. 8 is a conceptual block diagram of an electronic system such as may incorporate phase change memories in accordance with the principles of the present invention.

The programmable resistance memory described in the discussion related to the previous figures may be employed to particular advantage in a wide variety of systems. The schematic diagram of FIG. 8 will be discussed to illustrate the devices' use in a few such systems. The schematic diagram of FIG. 8 includes many components and devices, some of which may be used for specific embodiments of a system in accordance with the principles of the present invention and while others not used. In other embodiments, other similar systems, components and devices may be employed. In general, the system includes logic circuitry configured to operate along with programmable resistance memory which may include phase change memory. The logic circuitry may be discrete, programmable, application-specific, or in the form of a microprocessor, microcontroller, or digital signal processor, for example. In some embodiments, the logic circuitry may be implemented using thin film logic. And the embodiments herein may also be employed on integrated chips or connected to such circuitry. The exemplary system of FIG. 8 is for descriptive purposes only. Although the description may refer to terms commonly used in describing particular computer, communications, tracking, and entertainment systems; the description and concepts equally apply to other systems, including systems having architectures dissimilar to that illustrated in FIG. 8. The electronic system 800, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 8 may employ a programmable resistance memory or a chalcogenide electronic device, such as a chalcogenide-based nonvolatile memory and/or threshold switch, for example.

In an illustrative embodiment, the system 800 may include a central processing unit (CPU) 805, which may be implemented with some or all of a microprocessor, a random access memory (RAM) 810 for temporary storage of information, and a read only memory (ROM) 815 for permanent storage of information. A memory controller 820 is provided for controlling RAM 810. In accordance with the principles of the present invention, all of, or any portion of, any of the memory elements (e.g. RAM or ROM) may be implemented as a programmable resistance memory which may include chalcogenide-based nonvolatile memory.

An electronic system 800 in accordance with the principles of the present invention may be a microprocessor that operates as a CPU 805, in combination with embedded chalcogenide-based electronic nonvolatile memory that operates as RAM 810 and/or ROM 815, or as a portion thereof. In this illustrative example, the microprocessor/chalcogenide-nonvolatile memory combination may be standalone, or may operate with other components, such as those of FIG. 8 yet-to-be described.

In implementations within the scope of the invention, a bus 830 interconnects the components of the system 800. A bus controller 825 is provided for controlling bus 830. An interrupt controller 835 may or may not be used for receiving and processing various interrupt signals from the system components. Such components as the bus 830, bus controller 825, and interrupt controller 835 may be employed in a large-scale implementation of a system in accordance with the principles of the present invention, such as that of a standalone computer, a router, a portable computer, or a data storage system, for example.

Mass storage may be provided by diskette 842, CD ROM 847, or hard drive 852. Data and software may be exchanged with the system 800 via removable media such as diskette 842 and CD ROM 847. Diskette 842 is insertable into diskette drive 841 which is, in turn, connected to bus 830 by a controller 840. Similarly, CD ROM 847 is insertable into CD ROM drive 846 which is, in turn, connected to bus 830 by controller 845. Hard disc 852 is part of a fixed disc drive 851 which is connected to bus 830 by controller 850. Although conventional terms for storage devices (e.g., diskette) are being employed in this description of a system in accordance with the principles of the present invention, any or all of the storage devices may be implemented using programmable resistance memory which may include chalcogenide-based nonvolatile memory in accordance with the principles of the present invention. Removable storage may be provided by a nonvolatile storage component, such as a thumb drive, that employs a chalcogenide-based nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 840, 845, and 850, for example.

User input to the system 800 may be provided by any of a number of devices. For example, a keyboard 856 and mouse 857 are connected to bus 630 by controller 855. An audio transducer 896, which may act as both a microphone and/or a speaker, is connected to bus 830 by audio controller 897, as illustrated. Other input devices, such as a pen and/or tabloid may be connected to bus 830 and an appropriate controller and software, as required, for use as input devices. DMA controller 860 is provided for performing direct memory access to RAM 810, which, as previously described, may be implemented in whole or part using chalcogenide-based nonvolatile memory devices in accordance with the principles of the present invention. A visual display is generated by video controller 865 which controls display 870. The display 870 may be of any size or technology appropriate for a given application.

In a cellular telephone or portable entertainment system embodiment, for example, the display 870 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 800 may also include a communications adaptor 890 which allows the system to be interconnected to a local area network (LAN) or a wide area network (WAN), schematically illustrated by bus 891 and network 895. An input interface 899 operates in conjunction with an input device 893 to permit a user to send information, whether command and control, data, or other types of information, to the system 800. The input device and interface may be any of a number of common interface devices, such as a joystick, a touch-pad, a touch-screen, a speech-recognition device, or other known input device. In some embodiments of a system in accordance with the principles of the present invention, the adapter 890 may operate with transceiver 873 and antenna 875 to provide wireless communications, for example, in cellular telephone, RFID, and wifi computer implementations.

Operation of system 800 is generally controlled and coordinated by operating system software. The operating system controls allocation of system resources and performs tasks such as processing scheduling, memory management, networking, and I/O services, among other things. In particular, an operating system resident in system memory and running on CPU 805 coordinates the operation of the other elements of the system 800.

In illustrative handheld electronic device embodiments of a system 800 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 855, keyboard 856 and mouse 857, for example. Embodiments with a transmitter, recording capability, etc., may also include a microphone input (not shown).

In an illustrative RFID transponder implementation of a system 800 in accordance with the principles of the present invention, the antenna 875 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 873 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 873 as an "answerback" signal on the antenna 875 at a second carrier frequency $F_2$. In passive RFID systems, power is derived from the interrogating signal and memory such as provided by a chalcogenide-based nonvolatile memory in accordance with the principles of the present invention is particularly well suited to such use. The term controller may be used herein in reference to various embodiments, including discrete logic, bit slice, microcontroller, microprocessor, array logic, or multi-core controllers, for example.

I claim:

1. A phase change memory comprising:
   a phase change memory cell; and
   a pulse generator, the pulse generator configured to provide minimal-width RESET pulses for the phase change memory cell, the minimal-width RESET pulses yielding a time-at-melt of no more than 10 ns longer than the minimal time-at-melt required to RESET the memory cell.

2. The memory of claim 1, wherein a plurality of phase change memory cells are included in an array of memory cells and the minimal-width RESET pulse is sufficient in amplitude and duration to program the least-readily amorphized memory cell within the array to a RESET state.

3. The phase change memory of claim 2, wherein the pulse generator is configured to provide minimal-width RESET pulses that yield a time-at-melt no more than 10 ns longer than the minimal time-at-melt required to RESET the least readily RESET memory cell within the array.

4. The phase change memory of claim 2, wherein the pulse generator is configured to provide RESET pulses of no more than 20 ns in duration.

5. A phase change memory comprising:
   a phase change memory cell; and
   a pulse generator, the pulse generator configured to provide a plurality of sub-minimal-width RESET pulses for the phase change memory cell, the plurality of sub-minimal-width RESET pulses yielding a cumulative time-at-melt no more than 10 ns longer than the minimal time-at-melt required to RESET the memory cell.

6. A programmable resistance memory comprising:
   an array of programmable resistance memory cells, the array including a plurality of phase-change memory cells; and
   a programmable resistance pulse generator, the pulse generator configured to provide an electronic access pulse characterized by a total width and an amplitude, the total width including rising and falling edges and a plateau period between the rising and falling edges, the pulse generator further configured to provide a minimal-width RESET pulse, the minimal-width RESET pulse being of sufficient duration to program the least-readily amorphized phase-change memory cell within the array to a RESET state, the programming of the least-readily amorphized phase-change memory cell requiring a minimal time at melt, the total width of the minimal-width RESET pulse including a margin in time at melt in excess of the minimal time at melt, the margin being less than 20 percent of the total width of the minimal-width RESET pulse.

7. The memory of claim 6, wherein the electronic access pulse is a current-limited pulse.

8. The memory of claim 6, wherein the electronic access pulse is a voltage-limited pulse.

9. A programmable resistance memory comprising:
   an array of programmable resistance memory cells, the array including a plurality of phase-change memory cells; and
   a programmable resistance pulse generator, the pulse generator configured to provide an electronic access pulse characterized by a total width and an amplitude, the total width including rising and falling edges and a plateau period between the rising and falling edges, the pulse generator further configured to provide a minimal-width RESET pulse, the minimal-width RESET pulse being of sufficient duration to program the least-readily amorphized phase-change memory cell within the array to a RESET state, the programming of the least-readily amorphized phase-change memory cell requiring a minimal time at melt, the total width of the minimal-width RESET pulse including a margin in time at melt in excess of the minimal time at melt, the rising edge of the minimal-width RESET pulse having a width of less that 20 percent of the total width of the minimal-width RESET pulse.

10. A programmable resistance memory comprising:
    an array of programmable resistance memory cells, the array including a plurality of phase-change memory cells; and
    a programmable resistance pulse generator, the pulse generator configured to provide an electronic access pulse characterized by a total width and an amplitude, the total width including rising and falling edges and a plateau period between the rising and falling edges, the pulse generator further configured to provide a minimal-width RESET pulse, the minimal-width RESET pulse being of sufficient duration to program the least-readily amorphized phase-change memory cell within the array to a RESET state, the programming of the least-readily amorphized phase-change memory cell requiring a minimal time at melt, the total width of the minimal-width RESET pulse including a margin in time at melt in excess of the minimal time at melt, the falling edge of the minimal-width RESET pulse having a width of less that 20 percent of the total width of the minimal-width RESET pulse.

11. A programmable resistance memory comprising:
    an array of programmable resistance memory cells, the array including a plurality of phase-change memory cells; and
    a programmable resistance pulse generator, the pulse generator configured to provide an electronic access pulse characterized by a total width, an amplitude and a time at melt, the total width including rising and falling edges and a plateau period between the rising and falling edges, the time at melt being greater than 50% of the plateau period, the pulse generator further configured to provide a minimal-width RESET pulse, the minimal-width RESET pulse being of sufficient duration to program the least-readily amorphized phase-change memory cell within the array to a RESET state, the programming of the least-readily amorphized phase-change memory cell requiring a minimal time at melt, the total width of the minimal-width RESET pulse including a margin in time at melt in excess of the minimal time at melt.

12. A method comprising the steps of:
    generating a minimal-width RESET pulse sufficient in amplitude and duration to RESET the least readily RESET memory cell in a phase change memory array; and
    applying the minimal-width RESET pulse to a selected phase change memory cell to RESET the memory cell and
    testing the memory cells within an array to determine the amplitude and duration of the minimal-width RESET pulse.

13. A method comprising the steps of:
generating a plurality of sub-minimal-width RESET pulses sufficient in amplitude and cumulative duration to RESET the least readily RESET memory cell in a phase change memory array, the plurality of sub-minimal-width RESET pulses yielding a cumulative time-at-melt no more than 10 ns longer than the minimal time-at-melt required to RESET the least readily reset memory cell; and applying the plurality of sub-minimal-width RESET pulses to a selected phase change memory cell of the array to RESET the memory cell.

14. The method of claim 13, wherein the plurality of sub-minimal-width RESET pulses yields a cumulative time-at-melt of no more than 10 ns.

* * * * *